United States Patent [19]

Ishihara et al.

[11] Patent Number: 4,837,048
[45] Date of Patent: Jun. 6, 1989

[54] METHOD FOR FORMING A DEPOSITED FILM

[75] Inventors: Shunichi Ishihara, Ebina; Jun-ichi Hanna; Isamu Shimizu, both of Yokohama, all of Japan

[73] Assignee: Canon Kabushiki Kaisha, Tokyo, Japan

[21] Appl. No.: 920,189

[22] Filed: Oct. 17, 1986

[30] Foreign Application Priority Data

Oct. 24, 1985 [JP] Japan ................... 60-238495
Oct. 25, 1985 [JP] Japan ................... 60-238902

[51] Int. Cl.$^4$ .................. B05D 5/06; B05D 5/12
[52] U.S. Cl. ........................... 427/69; 427/70; 427/255; 427/255.3; 437/225; 437/233; 437/234
[58] Field of Search .............. 427/69, 70, 255.3, 255, 427/95, 248.1, 87, 86, 85, 249; 437/225, 233, 234

[56] References Cited

U.S. PATENT DOCUMENTS

| Re. 31,708 | 10/1984 | Gordon | 427/126.2 |
|---|---|---|---|
| 2,552,626 | 5/1951 | Fisher et al. | 201/64 |
| 3,083,550 | 4/1963 | Auerbach | 65/3 |
| 3,188,230 | 6/1965 | Bakish et al. | 117/107.1 |
| 3,203,827 | 8/1965 | Hill | 117/107.2 |
| 3,218,204 | 11/1965 | Ruehrwein | 148/175 |
| 3,224,912 | 12/1965 | Ruehrwein | 148/175 |
| 3,306,768 | 2/1967 | Peterson | 117/106 |
| 3,466,191 | 9/1969 | Stinchfield et al. | 117/213 |
| 3,506,556 | 4/1970 | Gillery et al. | 204/192 |
| 3,655,429 | 4/1972 | Deklerk | 117/106 |
| 3,664,866 | 5/1972 | Manasevit | 117/201 |
| 3,850,679 | 11/1974 | Sopko et al. | 117/106 R |
| 3,870,558 | 3/1975 | Shimizu et al. | 117/201 |
| 3,984,587 | 10/1976 | Lipp | 427/255.3 |
| 4,058,430 | 11/1977 | Suntola et al. | 156/611 |
| 4,096,822 | 6/1978 | Yamawaki et al. | 118/48 |
| 4,146,657 | 3/1979 | Gordon | 427/126 |
| 4,180,596 | 12/1979 | Crowder et al. | 427/42 |
| 4,206,252 | 6/1980 | Gordon | 427/160 |
| 4,239,811 | 12/1980 | Kemlage | 427/255.3 |
| 4,282,267 | 8/1981 | Kuyel | 427/91 |
| 4,328,261 | 5/1982 | Heinecke et al. | 427/91 |
| 4,357,179 | 11/1982 | Adams et al. | 427/95 |
| 4,359,490 | 11/1982 | Lehrer | 427/95 |
| 4,402,762 | 9/1983 | John et al. | 427/87 |
| 4,416,217 | 11/1983 | Nakamura et al. | 118/696 |
| 4,422,407 | 12/1983 | Bessot et al. | 118/723 |
| 4,448,801 | 5/1984 | Fukuda et al. | 427/87 |
| 4,515,107 | 5/1985 | Fournier et al. | 118/718 |
| 4,522,663 | 6/1985 | Ovshinsky et al. | 427/86 |
| 4,526,809 | 7/1985 | Hall et al. | 427/74 |
| 4,529,679 | 7/1985 | Ogawa et al. | 430/84 |
| 4,554,180 | 11/1985 | Hirooka | 427/248.1 |
| 4,595,601 | 6/1986 | Horioka et al. | 427/53.1 |
| 4,615,905 | 10/1986 | Ovshinsky et al. | 427/86 |
| 4,637,938 | 1/1987 | Lee et al. | 427/53.1 |
| 4,650,539 | 3/1987 | Irvine et al. | 156/613 |
| 4,652,463 | 3/1987 | Peters | 427/87 |
| 4,751,192 | 6/1988 | Hirooka et al. | 437/4 |

FOREIGN PATENT DOCUMENTS 2038086 7/1980 United Kingdom ................. 427/87

Primary Examiner—Sadie Childs
Attorney, Agent, or Firm—Fitzpatrick, Cella, Harper & Scinto

[57] ABSTRACT

A deposited film is formed by introducing a gaseous starting material, a gaseous halogenic oxidizing agent and at least one oxygen or nitrogen type oxidizing agent into a reaction space to form excited precursors and thereafter forming a deposited film on a substrate in a film forming space employing the excited precursors. If desired, a gaseous material containing a component for valence electron control can be added to the reaction space.

35 Claims, 1 Drawing Sheet

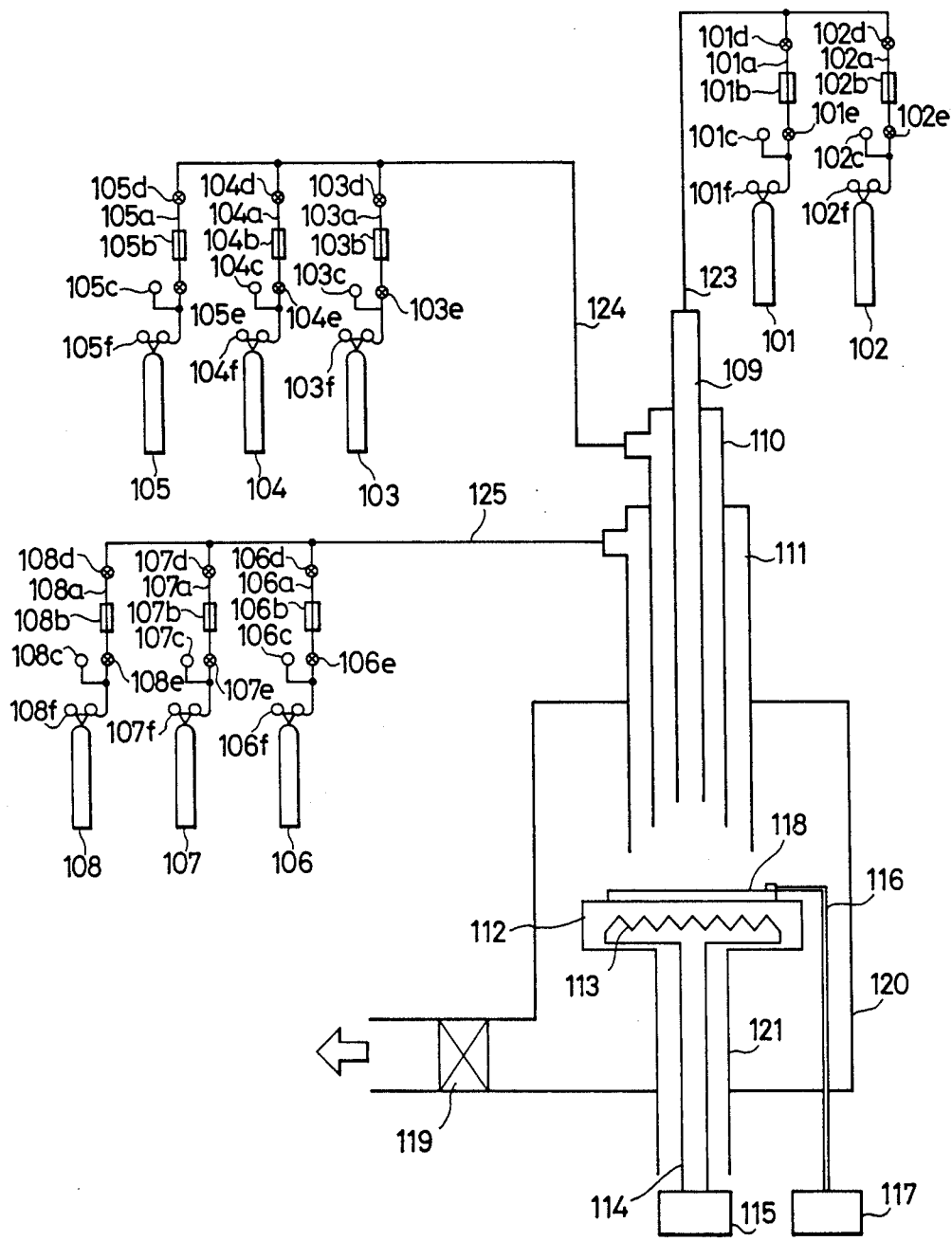

METHOD FOR FORMING A DEPOSITED FILM

BACKGROUND OF THE INVENTION

1. Field on the Invention

This invention relates to a method for formation of a functional film, particularly a functional deposited film which is useful for uses such as semiconductor device, photosensitive device for electrophotography, electronic device such as optical input sensor device for optical image inputting device, etc.

2. Description of the Prior Art

In the prior art, for amorphous or polycrystalline functional films such as semiconductor films, insulating films, photoconductive films, magnetic films or metal films, individually suitable film forming methods have been employed from the standpoint of desired physical characteristics, uses, etc.

For example, for formation of silicon deposited films such as amorphous or polycrystalline, non-single crystalline silicon, which are optionally compensated for lone pair electrons with a compensating agent such as hydrogen atoms (H) or halogen atoms (X), etc., (hereinafter abbreviated as "NON-Si (H,X)", particularly "A-Si (H,X)" when indicating an amorphous silicon and "poly-Si) (H,X)" when indicating a polycrystalline silicon) (the so called microcrystalline silicon is included within the category of A-Si (H,X) as a matter of course), there have been attempted the vacuum vapor deposition method, the plasma CVD method, the thermal CVD method, the reaction sputtering method, the ion plating method, the optical CVD method, etc. Generally, the plasma CVD method has been widely used and industrialized.

However, the reaction process in formation of a silicon deposited film according to the plasma CVD method which has been generalized in the prior art is considerably complicated as compared with the CVD method of the prior art, and its reaction mechanism involves not a few ambiguous points. Also, there are a large number of parameters for formation of a deposited film (for example, substrate temperature, flow rate and flow rate ratio of the introduced gases, pressure during formation, high frequency power, electrode structure, structure of the reaction vessel, speed of evacuation, plasma generating system, etc.). Owing to the combination of such a large number of parameters, the plasma may sometimes become unstable state, whereby marked deleterious influences were exerted frequently on the deposited film formed. Besides, the parameters characteristic of the device must be selected for each device and therefore under the present situation it has been difficult to generalize the production conditions.

On the other hand, for the silicon type deposited film to exhibit sufficiently satisfactory electric and optical characteristics for respective uses, it is now accepted that the best way to form it is according to the plasma CVD method.

However, depending on the application use of the silicon deposited film, bulk production with reproducibility must be attempted with full satisfaction of enlargement of area, uniformity of film thickness as well as uniformity of film quality, and therefore in formation of a silicon deposited film according to the plasma CVD method, enormous installation investment is required for a bulk production device and also management items for such bulk production become complicated, with a width of management tolerance being narrow and the control of the device being severe. These are pointed as the problems to be improved in the future.

Also, in the case of the plasma CVD method, since plasma is directly generated by high frequency or microwave, etc., in the film forming space in which a substrate on which a film is formed is arranged, electrons or a number of ion species generated may damage the film during the film forming process to cause lowering in film quality or non-uniformization of film quality.

As an improvement of this point, the indirect plasma CVD method has been proposed.

The indirect plasma CVD method has elaborated the technique to use selectively the effective chemical species for film formation by forming plasma with microwave, etc., at an upstream position apart from the film forming space and transporting said plasma to the film forming space.

However, even in the case of such a plasma CVD method, transport of plasma is essentially required and therefore the chemical species effective for film formation must have long life, whereby the gas species which can be employed are spontaneously limited, thus failing to give various deposited films. Also, enormous energy is required for the generation of plasma, and the generation of the chemical species effective for film formation and their amounts cannot be substantially placed under simple management. Thus, various problems remain to be solved.

As contrasted to the plasma CVD method, the optical CVD method is advantageous in that no ion species or electrons are generated which give damage the film quality during the film formation. However, there are problems such that the light source does not include a wide variety so that the wavelength of the light source tends to be toward UV-ray range, that a large scale light source and its power source are required in the case of industrialization, that the window for permitting the light from the light source to be introduced into the film forming space is coated with a film during the film formation which results in lowering the light intensity during film formation, which may further lead to shutdown of the light from the light source into the film forming space.

As described above, in the formation of silicon type deposited films, the problems to be solved still remain, and it has been earnestly desired to develop a method for forming a deposited film which is capable of bulk production with attempting to save energy by means of a device of low cost, while maintaining the characteristics as well as uniformity which are available in practice. Particularly, for the film formation of a semiconductor film of p-, n- or i-type conduction while enhancing the doping rate, the degree of the above requirement is high. These are also applicable for other functional films such as silicon nitride films, silicon carbide films and silicon oxide films, similar problems which should be solved respectively.

SUMMARY OF THE INVENTION

An object of the present invention is to remove the drawbacks of the method for forming deposited films as described above and at the same time to provide a novel method for forming a deposited film without use of the formation method of the prior art.

Another object of the present invention is to provide a method for forming a deposited film capable of saving energy and at the same time obtaining a deposited film having uniform characteristics over a large area with easy management of film quality.

Still another object of the present invention is to provide a method for forming a deposited film by which a film excellent in productivity and bulk productivity, having high quality as well as excellent physical characteristics such as electrical, optical, semiconductor characteristics, etc., can be easily obtained.

According to one aspect of the present invention, there is provided a method for forming a deposited film which comprises introducing a gaseous starting material for formation of a deposited film, a gaseous halogenic oxidizing agent (X) having the property of oxidation action on said starting material, and at least one oxidizing agent (ON) of gaseous oxygen type and nitrogen type oxidizing agents having the same property into a reaction space to effect chemical contact among them to thereby form a plural number of precursors containing precursors under excited states, and forming a deposited film on a substrate existing in the film forming space with the use of at least one precursor of these precursors as the feeding source for the constituent element of the deposited film.

According to another aspect of the present invention, there is provided a method for forming a deposited film which comprises introducing a gaseous starting material for formation of a deposited film, a a gaseous halogenic oxidizing agent (X) having the property of oxidation action on said starting material at least one oxidizing agent (ON) of gaseous oxygen type and nitrogen type oxidizing agents, and a gaseous material (D) containing a component for valence electron controller as the constituent into a reaction space to effect chemical contact among them to thereby form a plural number of precursors containing precursors under excited states, and forming a deposited film on a substrate existing in the film forming space with the use of at least one precursor of these precursors as the feeding source for the constituent element of the deposited film.

BRIEF DESCRIPTION OF THE DRAWING

FIG. 1 is a schematic illustration of a film forming device used in Examples of the present invention

DESCRIPTION OF THE PREFERRED EMBODIMENTS

In the method for forming a deposited film of the present invention, the gaseous starting material to be used for the formation of a deposited film receives oxidizing action through chemical contact with gaseous oxidizing agents and can be selected suitably as desired depending on the kind, the characteristic, use, etc., of the desired deposited film. In the present invention, the above gaseous starting material and the gaseous oxidizing agents may be those which can be made gaseous on chemical contact, and they can be either liquid or solid in their ordinary state.

In the method for forming a deposited film of the present invention, the gaseous material (D), which contains a component for a valence electron controller as the constituent and is optionally used, is subjected to oxidizing action through chemical contact with a gaseous oxidizing agent and can be selected suitably as desired depending on the kind, the characteristic, use, etc., of the desired deposited film. In the present invention, the above gaseous starting material, the gaseous material (D), and the gaseous oxidizing agent may be those which can be made gaseous on chemical contact, and they can be either liquid or solid in the ordinary state.

When the starting material for formation of a deposited film, the material (D) or an oxidizing agent is liquid or solid in the ordinary state, the starting material for formation of a deposited film, the material (D), and the oxidizing agent are introduced in gaseous state into the reaction space while performing bubbling by the use of carrier gas such as Ar, He, $N_2$, $H_2$, etc., optionally with application of heat.

During this operation, the partial pressures and mixing ratio of the above gaseous starting material, the material (D), and the gaseous oxidizing agent may be set by controlling the flow rate of the carrier gas or the vapor pressures of the starting material for formation of the deposited film and the gaseous oxidizing agent.

As the starting material for the formation of a deposited film to be used in the present invention, for example, if tetrahedral type deposited films such as semiconductive silicon deposited films or germanium deposited films, etc., are desired to be obtained, straight chain and branched chain silane compounds, cyclic silane compounds, chain germanium compounds, etc., may be employed as effective ones.

Specifically, examples of straight chain silane compounds may include $Si_nH_{2n+2}$ (n=1, 2, 3, 4, 5, 6, 7, 8), examples of branched chain silane compounds include $SiH_3SiH(SiH_3)SiH_2SiH_3$, and examples of chain germanium compounds include $Ge_mH_{2m+2}$ (m=1, 2, 3, 4, 5), etc. In addition to these compounds, for example, hydrogenated tin such as $SnH_4$, etc., may be employed together as the starting material for the formation of a deposited film.

Of course, these silicon type compounds and germanium type compounds may be used either as a single kind or as a mixture of two or more kinds.

The oxidizing agents to be used in the present invention are gaseous when introduced into the reaction space and at the same time have the property of effectively oxidizing the gaseous starting material for formation of a deposited film introduced into the reaction space by mere chemical contact therewith, including oxygen type oxidizing agents, nitrogen type oxidizing agents, halogenic oxidizing agents, specifically oxygens such as air, oxygen, ozone, etc., oxygen or nitrogen containing compounds such as $N_2O_4$, $N_2O_3$, $N_2O$, etc., peroxides such as $H_2O_2$, etc., halogenic gases such as $F_2$, $Cl_2$, $Br_2$, $I_2$, etc., and fluorine, chlorine, bromine, etc., under nascent state as effective ones.

These oxidizing agents are introduced into the reaction space under gaseous state together with the gas of the starting material for formation of a deposited film and the above material (D) as described above with a desired flow rate and a feeding pressure, wherein they are mixed with and collided against the above starting material and the above material (D) to be chemically contacted therewith, thereby oxidizing the above starting material and the above material (D) to generate efficiently plural kinds of precursors containing precursors under excited states. Of the precursors under excited states and other precursors generated, at least one of them functions as the feeding source for the constituent element of the deposited film formed.

The precursors generated may undergo decomposition or reaction to be converted onto other precursors under excited states or to precursors under another excited state, or alternatively in their original forms, if desired, although releasing energy to contact the substrate surface arranged in a film forming space, whereby a deposited film having a three-dimensional network structure is prepared.

As the excited energy level, it is preferable that the precursor under the above excited states should be at an energy level accompanied by luminescence in the process of energy transition to a lower energy level or alternatively changing to another chemical species. By formation of an activated precursor including the precursor under excited states attended any luminescence in such a transition of energy, the deposited film forming process of the present invention proceeds with better efficiency and greater energysaving to form a deposited film having uniform and better physical characteristics over the whole film surface.

In the present invention, the proportion of the halogenic oxidizing agent to the oxygen type and/or a nitrogen type oxidizing agent introduced into the reaction space may be determined suitably depending on the kind and the desired characteristics of the deposited film to be prepared, but preferably is 1000/1 to 1/50, more preferably from 500/1 to 1/20, and optimally from 100/1 to 1/10.

In the method of the present invention, as the material (D), which contains a component for a valence electron controller as the constituent and is optionally used, it is preferable to select a compound which is in gaseous state under normal temperature and normal pressure, or a gas or readily gasifiable by means of a suitable gasifying device under the conditions for forming a deposited film.

As the material (D) to be used in the present invention, in the case of a silicon type semiconductor film and a germanium type semiconductor film, there may be employed compounds cnotaining the p type valence electron controller, which functions as the so called p type impurity, namely an element in the group IIIA of the periodic table such as B, Al, Ga, In, Tl, etc., and the n type valence electron controller which functions as the so called n type impurity, namely an element in the group VA of the periodic table such as N, P, As, Sb, Bi, etc.

Specific examples may include $NH_3$, $HN_3$, $N_2H_5N_3$, $N_2H_4$, $NH_4N_3$, $PH_3$, $P_2H_4$, $AsH_3$, $SbH_3$, $BiH_3$, $B_2H_6$, $B_4H_{10}$, $B_5H_9$, $B_5H_{11}$, $B_6H_{10}$, $B_6H_{12}$, $Al(CH_3)_3$, $Al(C_2H_5)_3$, $Ga(CH_3)_3$, $In(CH_3)_3$, etc., as effective ones.

For introducing the gas of the above material (D) into the reaction space, it can be previously mixed with the above starting material for the formation of a deposited film prior to the introduction, or it can be introduced from independent plural number of gas feeding sources.

In the present invention, so that the deposited film forming process may proceed smoothly to form a film of high quality and having desired physical characteristics, as the film forming factors, the kinds and combination of the starting material for the formation of a deposited film, the material (D), and the oxidizing agent, mixing ratio of these, pressure on mixing, flow rate, the inner pressure in the film forming space, the flow types of the gases, the film forming temperature (substrate temperature and atmosphere temperature) are suitably selected as desired. These film forming factors are related to each other, and they are not determined individually but determined respectively under mutual relationships. In the present invention, the ratio of the gaseous starting material for the formation of a deposited film and the gaseous oxidizing agent introduced into the reaction space may be determined suitably as determined relative to the film forming factors related among the film forming factors as mentioned above, but it is preferably 1/100 to 100/1, and more preferably 1/50–50/1 in terms of the flow rate ratio introduced.

The proportion of the gaseous material (D) may be as desired depending on the kind of the above gaseous starting material and the desired semiconductor characteristics of the deposited film to be prepared, but it is preferably 1/1000000 to 1/10, more preferably 1/100000 to 1/20, optimally 1/100000 to 1/50 based on the above gaseous starting material.

The pressure after mixing and when introduced into the reaction space may be preferably higher in order to enhance higher the chemical contact among the above gaseous starting material, the gaseous material (D), and the above gaseous oxidizing agent in probability, but it is better to determine the optimum value suitably as desired in view of the reactivity. Although the pressure on mixing may be determined as described above, each of the pressures upon introduction may be preferably $1 \times 10^{-7}$ atm to 10 atm, more preferably $1 \times 10^{-6}$ atm to 3 atm.

The pressure within the film forming space, namely the pressure in the space in which the substrate on which surfaces are subjected to the film formation is arranged so that the precursors (E) under exited states generated in the reaction space and sometimes the precursors (F) formed as secondary products from said precursors (E) may contribute effectively to the film formation.

The inner pressure in the film forming space, when the film forming space is continuous opened to the reaction space, can be controlled in relationship with the introduction pressures and flow rates of the gaseous starting material for formation of a deposited film, the gaseous material (D), and the gaseous oxidizing agent in the reaction space, for example, by application of a contrivance such as differential evacuation or use of a large scale evacuating device.

Alternatively, when the conductance at the connecting portion between the reaction space and the film forming space is small, the pressure in the film forming space can be controlled by providing an appropriate evacuating device in the film forming space and controlling the evacuation amount of said device.

On the other hand, when the reaction space and the film forming space are formed as one and the reaction position and the film forming position are only different in space, it is possible to effect differential evacuation or provide a large scale evacuating device having sufficient evacuating capacity as described above.

As described above, the pressure in the film forming space may be determined in relation to the introduction pressures of the gaseous starting material, the gaseous material (D), and the gaseous oxidizing agent introduced into the reaction space, but it is preferably 0.001 Torr to 100 Torr, more preferably 0.01 Torr to 30 Torr, optimally 0.05 Torr to 10 Torr.

As for the flow type of the gases, it is necessary to design the flow type in view of the geometric arrangement of the gas introducing inlet, the substrate, and the gas evacuating outlet so that when the starting material for formation of a deposited film, the material (D), and the oxidizing agent are uniformly and efficiently mixed during the introduction of these into the reaction space, the above precursors (E) may be efficiently generated and the film formation may be adequately done without trouble. A preferable example of the geometric arrangement is shown in FIG. 1.

As the substrate temperature (Ts) during the film formation, it can be set suitably as desired individually depending on the gas species employed and the kinds and the required characteristics of the deposited film to be formed, but, to obtain an amorphous film, it is preferably from room temperature to 450° C., more preferably from 50° to 400° C. Particularly, in the case of forming a silicon type deposited film having better semiconductor characteristics and photoconductive characteristics, etc., the substrate temperature (Ts) is desirably 70° to 350° C. On the other hand, in the case obtaining a polycrystalline film, it is preferably 200° to 650° C., more preferably 300° to 600° C.

As the atmosphere temperature (Tat) in the film forming space, it may be determined suitably as desired in relationship with the substrate temperature so that the above precursors (E) generated and the above precursors (F) are not changed to unsuitable chemical species for the film formation, and also the above precursors (E) may be efficiently generated.

The substrate to be used in the present invention may be either electroconductive or electrically insulating, provided that it is selected as desired depending on the use of the deposited film to be formed. As the electroconductive substrate, there may be mentioned materials such as NiCr, stainless steel, Al, Cr, Mo, Au, Ir, Nb, Ta, V, Ti, Pt, Pd etc. or alloys thereof.

As insulating substrates, there may be conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. At least one side surface of these substrates is preferably subjected to a treatment for imparting electroconductivity, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3 + SnO_2$) thereon. Alternatively, a synthetic resin film such as polyester film can be subjected to the electroconductive treatment on its surface by the vacuum vapor deposition, electron-beam deposition or sputtering of a metal such as NiCr, Al, Ag, Pb, Zn, Ni, Au, Cr, Mo, Ir, Nb, Ta, V, Ti, Pt, etc., or by a laminating treatment with said metal, thereby imparting electroconductivity to the surface. The substrate may be shaped in any form such as cylinders, belts, plates or others, and its form may be determined as desired.

The substrate is preferably selected from among those set forth above in view of the adhesion and reactivity between the substrate and the film. Further, if the difference in thermal expansion between both is great, a large amount of strain may be created within the film to produce, on occasion, film having poor quality, and therefore it is preferable to use a substrate so that the difference in thermal expansion between both is small.

Also, the substrate state of the substrate is directly related to the structure (orientation) of the film or generation of a stylet structures, and therefore it is desirable to treat the surface of the substrate to give a film structure and a film texture so that desired characteristics may be obtained.

FIG. 1 shows an example of a preferable device for practicing the method for forming a deposited film of the present invention.

The deposited film forming device shown in FIG. 1 is broadly classified into a main device, an evacuation system, and a gas feeding system.

In the main device, a reaction space and a film forming space are provided.

101-108 are respectively bombs filled with the gases to be used on the film formation, 101a-108a are respectively gas feeding pipes, 101b-108b are respectively mass flow controllers for controlling the flow rates of the gases from the respective bombs, 101c-108c are respectively gas pressure gauges, 101d-108d and 101e-108e are respectively valves, and 101f-108f are respectively pressure gauges indicating the pressures in the corresponding gas bombs.

120 is a vacuum chamber equipped at the upper portion with a pipeline for gas introduction, having a structure for formation of the reaction space downstream of the pipeline, and also having a structure for formation of a film forming space in which a substrate holder 112 is provided so that a substrate 118 may be provided as opposed to the gas discharging outlet of said pipeline. The pipeline for the gas introduction has a triple concentric arrangement structure, having from the innerside a first gas introducing pipe 109 for introducing the gases from the gas bombs 101 and 102, a second gas introducing pipe 110 for introducing the gases from the gas bombs 103-105, and a third gas introducing pipe 111 for introducing the gases from the gas bombs 106-108.

As for the gas evacuation to the reaction space of each gas introducing pipe, its position is designed so as to be arranged at a position further from the surface position of the substrate as the pipe is nearer to the inner side. In other words, the gas introducing pipes are arranged so that the pipe on the outer side may enclose the pipe existing within the innerside thereof.

The gases from the respective bombs are fed into the respective introducing pipes through the gas feeding pipelines 123-125, respectively.

The respective gas introducing pipes, the respective gas feeding pipe lines, and the vacuum chamber 120 are evacuated to vacuum through the main vacuum valve 119 by means of a vacuum evacuating device not shown in the figure.

The substrate 118 is set at a suitable desired distance from the positions of the respective gas introducing pipes by moving vertically the substrate holder 112.

For the present invention, the distance between the substrate and the gas discharging outlet of the gas introducing pipe may be determined appropriately in view of the kinds and the desired characteristics of the deposited film to be formed, the gas flow rates, the inner pressure in the vacuum chamber, etc., but it is preferably from several mm to 20 cm, more preferably from about 5 mm to about 15 cm.

113 is a heater for heating the substrate which is provided in order to heat the substrate to an appropriate temperature on the film formation, or preheating the substrate 118 before the film formation, or further to anneal the film after the film formation.

The substrate heating heater 113 is supplied with power through a conductive wire 114 from a power source 115.

116 is a thermocouple for measuring the temperature of the substrate (Ts) and is electrically connected to the temperature display device 117.

The present invention described in more detail by referring to the following Examples.

Example 1

By the use of the film forming device shown in FIG. 1, a deposited film was prepared according to the process of the present invention as described below.

The $SiH_4$ gas filled in the bomb 101 was introduced at a flow rate of 20 sccm through the gas introducing pipe 109, the $F_2$ gas filled in the bomb 103 at a flow rate of 2 sccm through the gas introducing pipe 110, and the $O_2$ gas filled in the bomb 106 at a flow rate of 2 sccm and the He gas filled in the bomb 108 at a flow rate of 40 sccm through the gas introducing pipe 111 into the vacuum chamber 120.

During this operation, the pressure in the vacuum chamber 120 was made 100 mTorr by controlling the opening of the vacuum like valve 119. A quartz glass (15 cm×15 cm) was used for the substrate, and the distance between the gas introducing inlet 111 and the substrate was set at 3 cm. Blueish white luminescence was strongly observed in the mixing region of $SiH_4$ gas, $O_2$ gas, and $F_2$ gas. The substrate temperature (Ts) was set at from room temperature to 400° C. for respective samples as indicated in Table 1.

When gases were permitted to flow under such conditions for 3 hours, Si:O:H:F films having film thicknesses as shown in Table A-1 were deposited on the substrate.

TABLE A-1

| Sample No. | 1-1 | 1-2 | 1-3 | 1-4 | 1-5 |
|---|---|---|---|---|---|
| Substrate temperature (°C.) | 50 | 100 | 250 | 350 | 450 |
| Film thickness (μm) | 0.8 | 0.65 | 0.70 | 0.65 | 0.50 |

Next, when the substrate temperature was fixed at 300° C., and the flow rate of $SiH_4$ was varied, the respective samples prepared were found to have the film thicknesses shown in Table A-2.

The gases were flowed for 3 hours for each sample, and the $O_2$ gas flow rate was made 2 sccm, the $F_2$ gas flow rate 2 sccm, and the He gas flow rate 40 sccm, and the inner pressure 100 mTorr for each sample.

TABLE A-2

| Sample No. | 1-6 | 1-7 | 1-8 | 1-9 | 1-10 |
|---|---|---|---|---|---|
| $SiH_4$ flow rate (sccm) | 5 | 10 | 20 | 40 | 80 |
| Film thickness (Å) | 2000 | 4000 | 6500 | 6800 | 6800 |

Next, the substrate temperature was set at 300° C., $SiH_4$ gas flow rate at 20 sccm, $O_2$ gas flow rate at 2 sccm, $F_2$ gas flow rate at 2 sccm, and the inner pressure at 100 mTorr, and the He gas flow rate was varied variously. The respective samples obtained after flowing the respective gases for 3 hours were found to have the film thicknesses as shown in Table A-3.

TABLE A-3

| Sample No. | 1-11 | 1-12 | 1-13 | 1-14 | 1-15 | 1-16 |
|---|---|---|---|---|---|---|
| He flow rate (sccm) | 0 | 5 | 10 | 20 | 40 | 80 |
| Film thickness (Å) | 2000 | 5000 | 6500 | 6500 | 6500 | 6500 |

Next, the substrate temperature was set at 300° C., $SiH_4$ gas flow rate at 20 sccm, $O_2$ gas flow rate at 2 sccm, $F_2$ gas flow rate at 2 sccm, and He gas flow rate at 10 sccm, and the inner pressure was varied variously. The respective samples obtained were found to have the film thicknesses as shown in Table A-4.

TABLE A-4

| Sample No. | 1-17 | 1-18 | 1-19 | 1-20 | 1-21 |
|---|---|---|---|---|---|
| Internal pressure | 10 mTorr | 100 mTorr | 1 Torr | 10 Torr | 100 Torr |
| Film thickness (Å) | 2000 | 6500 | 6000 | 4000 | 3000 |

The distribution irregularity of the film thickness of the respective samples shown in Table A-1 to Table A-4 was found to be dependent on the distance between the gas introducing pipe 111 and the substrate, the gas flow rates flowed through the gas introducing pipes 109, 110, and 111, and the inner pressure. In each film formation, the distribution irregularity of film thickness could be controlled within ±5% in the substrate of 15 cm×15 cm by controlling the distance between the gas introducing pipe and the substrate. This position was found to correspond to the position of the maximum luminescence intensity in most cases. Also, the Si:O:H:F film formed in every sample was confirmed to be amorphous from the result of the electron beam diffraction.

Also, a sample for measurement of electroconductivity was prepared by vapor deposition of an aluminum comb-shaped electrode (gap length: 200 μm) on the amorphous Si:O:H:F film of each sample. Each sample was placed in a vacuum cryostat, a current of 100V was applied and the dark electroconductivity ($\sigma d$) was attempted to be determined by measuring the current by a minute amperemeter (YHP4140B). However, it was found to be lower than the measurable limit and the dark electroconductivity at room temperature was estimated to be $10^{-14}$ s/cm or less.

Example 2

The film formation was conducted by introducing $N_2O_4$ gas from the 107 bomb in place of the introduction of $O_2$ gas in Example 1 (Sample 2A).

The film forming conditions in this case are as follows:

$SiH_4$: 20 sccm
$F_2$: 2 sccm
$N_2O_2$: 2 sccm
He: 40 sccm
Inner pressure: 100 mTorr
Substrate temperature: 300° C.
Distance between gas blowing outlet and substrate: 3 cm Similarly as in Example 1, strong blue luminescence was observed in the region where $SiH_4$ gas and $N_2O_4$ gas were merged into one stream. After gas blowing for 3 hours, an A-Si:N:O:H:F film of about 6500 Å thickness was deposited on the quartz glass substrate.

This film was found to be amorphous as confirmed by the electron beam diffraction.

After an aluminum comb-shaped electrode (gap length 200 μm) was vapor deposited in vacuo on the A-Si:N:O:H:F film, the sample was placed in a vacuum cryostat, and the dark electroconductivity ($\sigma d$) was measured, but it was lower than the measurable limit similarly as in Example 1.

Example 3

In Example 1, the film formation was conducted by introducing $Si_2H_6$ gas from the 102 bomb in place of introducing $SiH_4$ gas (Sample 3A).

The film forming conditions in this case are as follows:

$Si_2H_6$: 20 sccm
$F_2$: 2 sccm
$O_2$: 5 sccm
He: 40 sccm
Inner pressure: 100 mTorr
Substrate temperature: 300° C.
Distance between gas blowing outlet and substrate: 2 cm After gas blowing for 3 hours, an A-Si:O:H:F film of about 1.5 μm thickness was deposited on the quartz glass substrate.

This film was confirmed to be amorphous by the electron beam diffraction.

After an aluminum comb-shaped electrode (gap length 200 μm) was vapor deposited in vacuo on the A-Si:O:H:F film, the sample was placed in a vacuum cryostat, and the dark electroconductivity ($\sigma d$) was measured, but it was lower than the measurable limit similarly as in Example 1.

Example 4

In Example 1, the film formation was conducted by introducing $GeH_4$ gas from the 102 bomb in place of introducing $SiH_4$ gas (Sample 4A).

The film forming conditions in this case are as follows:

$GeH_4$: 20 sccm
$F_2$: 2 sccm
$O_2$: 2 sccm
He: 40 sccm
Inner pressure: 100 mTorr
Substrate temperature: 300° C.
Distance between gas blowing outlet and substrate: 3 cm After gas blowing for 3 hours, an A-Ge:O:H:F film of about 5500 Å thickness was deposited on the quartz glass substrate. This film was confirmed to be amorphous by the electron beam diffraction.

After an aluminum comb-shaped electrode (gap length 200 μm) was vapor deposited in vacuo on the A-Ge:O:H:F film, the sample was placed in a vacuum cryostat, and the dark electroconductivity ($\sigma d$) was measured, but it was lower than the measurable limit similarly as in Example 1.

Example 5

In Example 1, the film formation was conducted by introducing $GeH_4$ gas from the 102 bomb simultaneously with the introduction of $SiH_4$ gas (Sample 5A).

The film forming conditions in this case are as follows:

$SiH_4$: 20 sccm
$GeH_4$: 5 sccm
$F_2$: 3 sccm
$O_2$: 5 sccm
He: 40 sccm
Inner pressure: 100 mTorr
Substrate temperature: 300° C.
Distance between gas blowing outlet and substrate: 3 cm After gas blowing for 3 hours, an A-SiGe:O:H:F film of about 7800 Å thickness was deposited on the quartz glass substrate. This film was confirmed to be amorphous by the electron beam diffraction.

After an aluminum comb-shaped electrode (gap length 200 μm) was vapor deposited in vacuo on the A-SiGe:O:H:F film, the sample 5A was placed in a vacuum cryostat, and the dark electroconductivity ($\sigma d$) was measured, but it was lower than the measurable limit similarly as in Example 1.

Example 6

In Example 5, the film formation was conducted by introducing $C_2H_4$ gas from the 102 bomb in place of the introduction of $GeH_4$ gas (Sample 6A).

The film forming conditions in this case are as follows:

$SiH_4$: 20 sccm
$C_2H_4$: 5 sccm
$F_2$: 2 sccm
$O_2$: 5 sccm
He: 40 sccm
Inner pressure: 100 mTorr
Substrate temperature: 300° C.
Distance between gas blowing outlet and substrate: 3 cm After gas blowing for 3 hours, an A-SiC:O:H:F film of about 6000 Å thickness was deposited on the quartz glass substrate. This film was confirmed to be amorphous by the electron beam diffraction.

After an aluminum comb-shaped electrode (gap length 200 μm) was vapor deposited in vacuo on the A-SiC:O:H:F film, the sample 6A was placed in a vacuum cryostat, and the dark electroconductivity ($\sigma d$) was measured, but it was lower than the measurable limit similarly as in Example 1.

Example 7

In Example 1, the film formation was conducted by introducing $Si_2H_6$ gas from the 102 bomb simultaneously with the introduction of $SiH_4$ gas (Sample 7A).

The film forming conditions in this case are as follows:

$SiH_4$: 20 sccm
$Si_2H_6$: 5 sccm
$F_2$: 3 sccm
$O_2$: 5 sccm
He: 40 sccm
Inner pressure: 100 mTorr
Substrate temperature: 300° C.
Distance between gas blowing outlet and substrate: 3 cm After gas blowing for 3 hours, an A-Si:O:H:F film of about 1.0 μm thickness was deposited on the quart glass substrate. This film was confirmed to be amorphous by the electron beam diffraction.

After an aluminum comb-shaped electrode (gap length 200 μm) was vapor deposited in vacuo on the A-Si:O:H:F film, the sample 7A was placed in a vacuum cryostat, and the dark electroconductivity ($\sigma d$) was measured, but it was lower than the measurable limit similarly as in Example 1.

Example 8

In Example 7, the film formation was conducted by introducing $N_2O_4$ gas from the 107 bomb in place of the introduction of $O_2$ gas (Sample 8A).

The film forming conditions in this case are as follows:

SiH$_4$: 20 sccm
Si$_2$H$_6$: 5 sccm
F$_2$: 3 sccm
N$_2$O$_4$: 5 sccm
He: 40 sccm
Inner pressure: 100 mTorr
Substrate temperature: 300° C.
Distance between gas blowing outlet and substrate: 3 cm After gas blowing for 3 hours, an A-Si:N:O:H:F film of about 1.0 μm thickness was deposited on the quartz glass substrate. This film was confirmed to be amorphous by the electron beam diffraction.

After an aluminum comb-shaped electrode (gap length 200 μm) was vapor deposited in vacuo on the A-Si:N:O:H:F film, the sample 8A was placed in a vacuum cryostat, and the dark electroconductivity ($\sigma$d) was measured, but it was lower than the measurable limit similarly as in Example 1.

Example 9

In Example 1, the film formation was conducted by introducing SnH$_4$ gas from the 102 bomb in place of the introduction of SiH$_4$ gas (Sample 9A).

The film forming conditions in this case are as follows:

SnH$_4$: 10 sccm
F$_2$: 5 sccm
O$_2$: 20 sccm
He: 40 sccm
Inner pressure: 100 mTorr
Substrate temperature: 300° C.
Distance between gas blowing outlet and substrate: 4 cm After gas blowing for 3 hours, an Sn:O:H:F film of about 3000 Å thickness was deposited on the quartz glass substrate. This film was found to be polycrystalline, since a diffraction peak was observed as confirmed by the electron beam diffraction.

After an aluminum comb-shaped electrode (gap length 200 μm) was vapor deposited in vacuo on said poly-Sn:O:H:F film, the sample was placed in a vacuum cryostat similarly as in Example 1, and the dark electroconductivity ($\sigma$d) was measured.

The obtained value was as follows:

$\sigma d = 8 \times 10^{-4}$ s/cm

Example 10

In Example 1, the film formation was conducted by setting the substrate temperature at 600° C. (Sample 10A).

The film forming conditions in this case are as follows:

SiH$_4$: 20 sccm
F$_2$: 2 sccm
O$_2$: 2 sccm
He: 40 sccm
Inner pressure: 100 mTorr
Distance between gas blowing outlet and substrate: 3 cm After gas blowing for 3 hours, an Si:O:H:F film of about 500 Å thickness was deposited on the quartz glass substrate. This film was found to be polycrystalline, since a diffraction peak of SiO$_2$ was observed when measured by the electron beam diffraction.

After an aluminum comb-shaped electrode (gap length 200 μm) was vapor deposited in vacuo on said poly-Si:O:H:F film, the sample 10A was placed in a vacuum cryostat similarly as in Example 1, and the dark electroconductivity ($\sigma$d) was measured, but it was found to be lower than the measurable limit similarly as in Example 1.

Example 11

In Example 1, the film formation was conducted by introducing Cl$_2$ gas from the 104 bomb simultaneously with the introduction of F$_2$ gas (Sample 11A).

The film forming conditions in this case are as follows:

SiH$_4$: 20 sccm
F$_2$: 2 sccm
Cl$_2$: 2 sccm
O$_2$: 2 sccm
He: 40 sccm
Inner pressure: 100 mTorr
Substrate temperature: 300° C.
Distance between gas blowing outlet and substrate: 3 cm Similarly as in Example 1, strong blue luminescence was observed in the region where SiH$_4$ gas, F$_2$ gas, Cl$_2$ gas, and O$_2$ gas were merged into one stream. After gas blowing for 3 hours, an A-Si:O:H:F:Cl of about 8000 Å thickness was deposited on the quartz substrate.

This film was confirmed to be amorphous by the electron beam diffraction.

After an aluminum comb-shaped electrode (gap length 200 μm) was vapor deposited in vacuo on said A-Si:O:H:F:Cl film, the sample was placed in a vacuum cryostat similarly as in Example 1, and dark electroconductivity ($\sigma$d) was measured, but it was found to be lower than the measurable limit similarly as in Example 1.

Example 12

In Example 1, the film formation was conducted by introducing Cl$_2$ gas from the 104 bomb in place of the introduction of F$_2$ gas (Sample 12A).

The film forming conditions in this case are as follows:

SiH$_4$: 20 sccm
Cl$_2$: 2 sccm
O$_2$: 2 sccm
He: 40 sccm
Inner pressure: 100 mTorr
Substrate temperature: 300° C.
Distance between gas blowing outlet and substrate: 3 cm Similarly as in Example 1, in the region where SiH$_4$ gas, Cl$_2$ gas, and O$_2$ gas were merged into one stream, strong blue luminescence was observed. After gas blowing for 3 hours, an A-Si:O:H:F:Cl film of about 3000 Å thickness was deposited on the quartz glass substrate. This film was confirmed to be amorphous by the electron beam diffraction.

After an aluminum comb-shaped electrode (gap length 200 μm) was vapor deposited in vacuo on said A-Si:O:H:F:Cl film, the sample 12A was placed in a vacuum cryostat similarly as in Example 1, and the dark electroconductivity ($\sigma$d) was measured, but it was found to be lower than the measurable limit similarly as in Example 1.

Example 13

By the use of the film forming device shown in FIG. 1, a deposited film was prepared according to the process of the present invention as described below.

The $SiH_4$ gas filled in the bomb 103 was introduced at a flow rate of 20 sccm and the $B_2H_6$ gas (diluted to 1% with $H_2$) filled in the bomb 104 at a flow rate of 2 sccm through the gas introducing pipe 110, the $F_2$ gas filled in the bomb 101 at a flow rate of 2 sccm through the gas introducing pipe 109, and the $O_2$ gas filled in the bomb 106 at a flow rate of 2 sccm and the He gas filled in the bomb 108 at a flow rate of 40 sccm through the gas introducing pipe 111 into the vacuum chamber 120.

During this operation, the pressure in the vacuum chamber 120 was made 100 mTorr by controlling the opening of the vacuum valve 119. A quartz glass (15 cm × 15 cm) was used for the substrate, and the distance between the gas introducing inlet 111 and the substrate was set at 3 cm. Blueish white luminescence was strongly observed in the mixing region of $SiH_4$ gas, $O_2$ gas, and $F_2$ gas. The substrate temperature (Ts) was set at from room temperature to 400° C. for respective samples as indicated in Table B-1.

When gases were permitted to flow under such conditions for 3 hours, Si:O:H:F:B films having film thicknesses as shown in Table B-1 were deposited on the substrate.

TABLE B-1

| Sample No. | B-1 | B-2 | B-3 | B-4 | B-5 |
|---|---|---|---|---|---|
| Substrate temperature (°C.) | 50 | 100 | 250 | 350 | 450 |
| Film thickness (μm) | 0.85 | 0.70 | 0.75 | 0.70 | 0.60 |
| σd (s/cm) | $3 \times 10^{-8}$ | $4 \times 10^{-8}$ | $5 \times 10^{-8}$ | $7 \times 10^{-8}$ | $8 \times 10^{-8}$ |

Next, when the substrate temperature was fixed at 300° C., and the flow rate of $SiH_4$ was varied, the respective samples prepared were found to have the film thicknesses shown in Table B-2.

The gases were flowed for 3 hours for each sample, and the $O_2$ gas flow rate was made 2 sccm, the $F_2$ gas flow rate 2 sccm, and the He gas flow rate 40 sccm, and the inner pressure 100 mTorr for each sample.

TABLE B-2

| Sample No. | B-6 | B-7 | B-8 | B-9 | B-10 |
|---|---|---|---|---|---|
| $SiH_4$ flow rate (sccm) | 5 | 10 | 20 | 40 | 80 |
| Film thickness (Å) | 2500 | 6000 | 7500 | 8000 | 8000 |
| σd (s/cm) | $4 \times 10^{-8}$ | $7 \times 10^{-8}$ | $5 \times 10^{-8}$ | $4 \times 10^{-8}$ | $1 \times 10^{-8}$ |

Next, the substrate temperature was set at 300° C., $SiH_4$ gas flow rate at 20 sccm, $O_2$ gas flow rate at 2 sccm, $F_2$ gas flow rate at 2 sccm, and the inner pressure at 100 mTorr, and the He gas flow rate was varied variously. The respective samples obtained after flowing the respective gases for 3 hours were found to have the film thicknesses as shown in Table B-3.

TABLE B-3

| Sample No. | B-11 | B-12 | B-13 | B-14 | B-15 | B-16 |
|---|---|---|---|---|---|---|
| He flow rate (sccm) | 0 | 5 | 10 | 20 | 40 | 80 |
| Film thickness (Å) | 4000 | 6000 | 7000 | 7500 | 7500 | 7500 |
| σd (s/cm) | $2 \times 10^{-8}$ | $4 \times 10^{-8}$ | $7 \times 10^{-8}$ | $6 \times 10^{-8}$ | $5 \times 10^{-8}$ | $7 \times 10^{-8}$ |

Next, the substrate temperature was set at 300° C., $SiH_4$ gas flow rate at 20 sccm, $O_2$ gas flow rate at 2 sccm, $F_2$ gas flow rate at 2 sccm, and He gas flow rate at 10 sccm, and the inner pressure was varied variously. The respective samples obtained were found to have the film thicknesses as shown in Table B-4.

TABLE B-4

| Sample No. | B-17 | B-18 | B-19 | B-20 | B-21 |
|---|---|---|---|---|---|
| Inner pressure | 10 mTorr | 100 mTorr | 1 Torr | 10 Torr | 100 Torr |
| Film thickness (Å) | 4000 | 7500 | 7500 | 7000 | 6000 |
| σd (s/cm) | $2 \times 10^{-8}$ | $5 \times 10^{-8}$ | $6 \times 10^{-8}$ | $5 \times 10^{-8}$ | $4 \times 10^{-8}$ |

The distribution irregularity of the film thickness of the respective samples shown in Table B-1 to Table B-4 was found to be dependent on the distance between the gas introducing pipe 111 and the substrate, the gas flow rates flowed through the gas introducing pipes 109, 110, and 111, and the inner pressure. In each film formation, the distribution irregularity of film thickness could be controlled within ±5% in the substrate of 15 cm × 15 cm by controlling the distance between the gas introducing pipe and the substrate. This position was found to correspond to the position of the maximum luminescence intensity in most cases. Also, the Si:O:H:F:B film formed in every sample was confirmed to be amorphous from the result of the electron beam diffraction.

Also, a sample for measurement of electroconductivity was prepared by vapor deposition of an aluminum comb-shaped electrode (gap length: 200 μm) on the amorphous Si:O:H:F:B film of each sample. Each sample was placed in a vacuum cryostat, a current of 100V was applied and the dark electroconductivity (σd) was attempted to be determined by measuring the current by a minute amperemeter (YHP4140B). The results are shown in Table B-1 to Table B-4. Every sample exhibited P type by the measurement of thermal electromotive force.

Example 14

The film formation was conducted by introducing $N_2O_4$ gas from the 107 bomb in place of the introduction of $O_2$ gas in Example 13 (Sample 2B).

The film forming conditions in this case are as follows:

$SiH_4$: 20 sccm
$F_2$: 2 sccm
$N_2O_4$: 2 sccm
$B_2H_6$ (1% $H_2$ dilution): 2 sccm
He: 40 sccm
Inner pressure: 100 mTorr
Substrate temperature: 300° C.
Distance between gas blowing outlet and substrate: 3 cm Similarly as in Example 13, strong blue luminescence was observed in the region where $SiH_4$ gas and $N_2O_4$ gas were merged into one stream. After gas blowing for 3 hours, an A-Si:N:O:H:F:B film of about 7000 Å thickness was deposited on the quartz glass substrate.

This film was found to be amorphous as confirmed by the electron beam diffraction.

After an aluminum comb-shaped electrode (gap length 200 μm) was vapor deposited in vacuo on the A-Si:N:O:H:F:B film, the sample was placed in a vacuum cryostat, and the dark electroconductivity ($\sigma d$) was measured similarly as in Example 13 to obtain a value of $3 \times 10^{-8}$ s/cm. The film was found to be P type by the measurement of thermal electromotive force.

Example 15

In Example 13, the film formation was conducted by introducing $Si_2H_6$ gas from the 105 bomb in place of introducing $SiH_4$ gas (Sample 3B).

The film forming conditions in this case are as follows:

$Si_2H_6$: 20 sccm
$F_2$: 2 sccm
$O_2$: 5 sccm
$B_2H_6$ (1% $H_2$ dilution): 2 sccm
He: 40 sccm
Inner pressure: 100 mTorr
Substrate temperature: 300° C.
Distance between gas blowing outlet and substrate: 3 cm After gas blowing fo 3 hours, an A-Si:O:H:F:B film of about 1.56 μm thickness was deposited on the quartz glass substrate.

This film was confirmed to be amorphous by the electron beam diffraction.

After an aluminum comb-shaped electrode (gap length 200 μm) was vapor deposited in vacuo on the A-Si:O:H:F:B film, the sample was placed in a vacuum cryostat, and the dark electroconductivity ($\sigma d$) was measured to obtain $\sigma d = 8 \times 10^{-9}$ scm. The film was also confirmed to be P type by the measurement of thermal electromotive force.

Example 16

In Example 13, the film formation was conducted by introducing $GeH_4$ gas from the 105 bomb in place of introducing $SiH_4$ gas (Sample 4B).

The film forming conditions in this case are as follows:

$GeH_4$: 20 sccm
$F_2$: 2 sccm
$O_2$: 2 sccm
$B_2H_6$ (1% $H_2$ dilution): 2 sccm
He: 40 sccm
Inner pressure: 100 mTorr
Substrate temperature: 300° C.
Distance between gas blowing outlet and substrate: 3 cm After gas blowing for 3 hours, an A-Ge:O:H:F:B film of about 6000 Å thickness was deposited on the quartz glass substrate. This film was confirmed to be amorphous by the electron beam diffraction.

After an aluminum comb-shaped electrode (gap length 200 μm) was vapor deposited in vacuo on the A-Ge:O:H:F:B film, the sample was placed in a vacuum cryostat to obtain a dark electroconductivity ($\sigma d$) of $4 \times 10^{-9}$ s/cm. The film was confirmed to be P type by the measurement of thermal electromotive force.

Example 17

In Example 13, the film formation was conducted by introducing $GeH_4$ gas from the 105 bomb simultaneously with the introduction of $SiH_4$ gas (Sample 5B).

The film forming conditions in this case are as follows:

$SiH_4$: 20 sccm
$GeH_4$: 5 sccm
$F_2$: 3 sccm
$O_2$: 5 sccm
$B_2H_6$ (1% $H_2$ dilution): 3 sccm
He: 40 sccm
Inner pressure: 100 mTorr
Substrate temperature: 300° C.
Distance between gas blowing outlet and substrate: 3 cm After gas blowing for 3 hours, an A-SiGe:O:H:F:B film of about 7700 Å thickness was deposited on the quartz glass substrate. This film was confirmed to be amorphous by the electron beam diffraction.

After an aluminum comb-shaped electrode (gap length 200 μm) was vapor deposited in vacuo on the A-SiGe:O:H:F:B film, the sample 5B was placed in a vacuum cryostat, and the dark electroconductivity ($\sigma d$) was measured to obtain a value of $3 \times 10^{-8}$ s/cm. The film was confirmed to be P type by the measurement of thermal electromotive force.

Example 18

In Example 17, the film formation was conducted by introducing $C_2H_4$ gas from the 102 bomb in place of the introduction of $GeH_4$ gas (Sample 6B).

The film forming conditions in this case are as follows:

$SiH_4$: 20 sccm
$C_2H_4$: 5 sccm
$F_2$: 2 sccm
$O_2$: 5 sccm
$B_2H_6$ (1% $H_2$ dilution): 3 sccm
He: 40 sccm
Inner pressure: 100 mTorr
Substrate temperature: 300° C.
Distance between gas blowing outlet and substrate: 3 cm After gas blowing for 3 hours, an A-SiC:O:H:F:B film of about 6500 Å thickness was deposited on the quartz glass substrate. This film was confirmed to be amorphous by the electron beam diffraction.

After an aluminum comb-shaped electrode (gap length 200 μm) was vapor deposited in vacuo on the A-SiC:O:H:F:B film, the sample 6B was placed in a vacuum cryostat, and the dark electroconductivity ($\sigma d$) was measured to obtain a value of $3 \times 10^{-10}$ s/cm. The film was confirmed to by P type by the measurement of thermal electromotive force.

In Example 13, the film formation was conducted by introducing $Si_2H_6$ gas from the 105 bomb simultaneously with the introduction of $SiH_4$ gas (Sample 7B).

The film forming conditions in this case are as follows:

$SiH_4$: 20 sccm
$Si_2H_6$: 5 sccm
$F_2$: 3 sccm
$O_2$: 5 sccm
$B_2H_6$ (1% $H_2$ dilution): 2sccm
He: 40 sccm
Inner pressure: 100 mTorr Substrate temperature: 300° C.
Distance between gas blowing outlet and substrate: 3 cm After gas blowing for 3 hours, an A-Si:O:H:F:B film of about 1.2 μm thickness was deposited on the quartz glass substrate. This film was confirmed to be amorphous by the electron beam diffraction.

After an aluminum comb-shaped electrode (gap length 200 μm) was vapor deposited in vacuo on the A-Si:O:H:F:B film, the sample 7B was placed in a vacuum cryostat, and the dark electroconductivity ($\sigma d$) was measured to obtain a value of $2 \times 10^{-8}$ s/cm. The film was confirmed to be P type by the measurement of thermal electromotive force.

Example 20

In example 19, the film formation was conducted by introducing $N_2O_4$ gas from the 107 bomb in place of the introduction of $O_2$ gas (Sample 8B).

The film forming conditions in this case are as follows:
SiH$_4$: 20 sccm
Si$_2$H$_6$: 5 sccm
F$_2$: 3 sccm
N$_2$O$_4$: 5 sccm
B$_2$H$_6$ (1% H$_2$ dilution): 3 sccm
He: 40 sccm
Inner pressure: 100 mTorr
Substrate temperature: 300° C.
Distance between gas blowing outlet and substrate: 3 cm After gas blowing for 3 hours, an A-Si:N:O:H:F:B film of about 1.1 μm thickness was deposited on the quartz glass substrate. This film was confirmed to be amorphous by the electron beam diffraction.

After an aluminum comb-shaped electrode (gap length 200 μm) was vapor deposited in vacuo on the A-Si:N:O:H:F:B film, the sample 8B was placed in a vacuum cryostat, and the dark electroconductivity ($\sigma d$) was measured to be $3 \times 10^{-10}$ s/cm. The film was confirmed to be P type by the measurement of thermal electromotive force.

Example 21

In Example 13, the film formation was conducted by setting the substrate temperature at 600° C. (Sample 9B).

The film forming conditions in this case are as follows:
SiH$_4$: 20 sccm
F$_2$: 2 sccm
O$_2$: 2 sccm
B$_2$H$_6$ (1% H$_2$ dilution): 2 sccm
He: 40 sccm
Inner pressure: 100 mTorr
Distance between gas blowing outlet and substrate: 3 cm After gas blowing for 3 hours, an Si:O:H:F:B film of about 600 Å thickness was deposited on the quartz glass substrate. This film was found to be polycrystalline, since a diffraction peak of SiO$_2$ was observed when measured by the electron beam diffraction.

After an aluminum comb-shaped electrode (gap length 200 μm) was vapor deposited in vacuo on said poly-Si:O:H:F:B film, the sample 10B was placed in a vacuum cryostat similarly as in Example 1, and the dark electroconductivity ($\sigma d$) was measured to be $3 \times 10^{-9}$ s/cm. Also, the film was confirmed to be P type by the measurement of thermal electromotive force.

Example 22

In Example 13, the film formation was conducted by introducing Cl$_2$ gas from the 102 bomb simultaneously with the introduction of F$_2$ gas (Sample 10B).

The film forming conditions in this case are as follows:
SiH$_4$: 20 sccm
F$_2$: 2 sccm
Cl$_2$: 2 sccm
O$_2$: 2 sccm
He: 40 sccm
B$_2$H$_6$ (1% H$_2$ dilution): 2 sccm
Inner pressure: 100 mTorr
Substrate temperature: 300° C.
Distance between gas blowing outlet and substrate: 3 cm Similarly as in Example 13, strong blue luminescence was observed in the region where SiH$_4$ gas, F$_2$ gas, Cl$_2$ gas, and O$_2$ gas were merged into one stream. After gas blowing for 3 hours, an A-Si:O:H:F:Cl:B of about 8500 Å thickness was deposited on the quartz substrate.

This film was confirmed to be amorphous by the electron beam diffraction.

After an aluminum comb-shaped electrode (gap length 200 μm) was vapor deposited in vacuo on said A-Si:O:H:F:Cl:B film, the sample was placed in a vacuum cryostat, and the dark electroconductivity ($\sigma d$) was measured similarly as in Example 13 to obtain a value of $3 \times 10^{-9}$ s/cm. The film was confirmed to be P type by measurement of thermal electromotive force.

Example 23

In Example 13, the film formation was conducted by introducing PH$_3$ gas from the 104 bomb in place of the introduction of B$_2$H$_6$ gas (Sample 11B).

The film forming conditions in this case are as follows:
SiH$_4$: 20 sccm
F$_2$: 2 sccm
O$_2$: 2 sccm
PH$_3$ (1% H$_2$ dilution): 2 sccm
He: 40 sccm
Inner pressure: 100 mTorr
Substrate temperature: 300° C.
Distance between gas blowing outlet and substrate: 3 cm Similarly as in Example 13, in the region where SiH$_4$ gas, F$_2$ gas, and O$_2$ gas were merged into one stream, strong blue luminescence was observed. After gas blowing for 3 hours, an A-Si:O:H:F:P film of about 6000 Å thickness was deposited on the quartz glass substrate. This film was confirmed to be amorphous by the electron beam diffraction.

After an aluminum comb-shaped electrode (gap length 200 μm) was vapor deposited in vacuo on said A-Si:O:H:F:P film, the sample was placed in a vacuum cryostat, and the dark electroconductivity ($\sigma d$) was measured similarly as in Example 13, to obtain a value of $3 \times 10^{-8}$. The film was confirmed to be N type by the measurement of thermal electromotive force.

Example 24

In Example 23, the film formation was conducted by introducing Cl$_2$ gas from the 102 bomb in place of the introduction of F$_2$ gas (Sample 12B).

The film forming conditions in this case are as follows:

SiH$_4$: 20 sccm
Cl$_2$: 2 sccm
O$_2$: 2 sccm
He: 40 sccm
PH$_3$ (1% H$_2$ dilution): 2 sccm
Inner pressure: 100 mTorr
Substrate temperature: 300° C.
Distance between gas blowing outlet and substrate: 3 cm Similarly as in Example 13, in the region where SiH$_4$ gas, Cl$_2$ gas, and O$_2$ gas were merged into one stream, strong blue luminescene was observed. After gas blowing for 3 hours, an A-Si:O:H:Cl:P film of about 2800 Å thickness was deposited on the quartz glass substrate. This film was confirmed to be amorphous by the electron beam diffraction.

After an aluminum comb-shaped electrode (gap length 200 μm) was vapor deposited in vacuo on said A-Si:O:H:Cl:P film, the sample was placed in a vacuum cryostsat, and the dark electroconductivity ($\sigma$d) was measured similarly as in Example 13 to obtain a value of $4 \times 10^{-8}$ s/cm. Also, the film was confirmed to be N type by the measurement of thermal electromotive force.

EFFECT OF THE INVENTION

As can be seen from the detailed description and the respective examples as set forth above, according to the deposition film forming method of the present invention, deposited films having uniform physical properties over a large area can be obtained with easy management of film quality at the same time as achievement of energy saving. Also, it is possible to obtain easily films excellent in productivity, bulk productivity, having high quality with excellent physical properties such as electrical, optical and semiconductor properties, etc.

What we claim is:

1. A method for forming a deposited film on a substrate in a reaction space, which comprises;
   introducing (a) a gaseous starting material for formation of a deposited film, (b) a gaseous halogenic oxidizing agent (X) having the property of oxidation action on said starting material, and (c) an oxidizing agent (ON) of gaseous oxygen type or nitrogen type oxidizing agents into said reaction space to form a mixture and effect chemical contact therebetween to thereby form a plural number of precursors containing precursors in an excited state, and
   forming said deposited film on said substrate in said reaction space through a gas introducing conduit system using at least one of said precursors as the feeding source for the constituent element of the deposited film, said gas introducing conduit system including a plurality of coaxially aligned conduits each having an exit orifice with an outer conduit adapted to carry said gaseous halogenic oxidizing agent, at least one inner conduit adapted to carry said gaseous starting material, and at least one inner conduit adapted to carry said oxidizing agent, said coaxially aligned conduits extending into the film forming space such that the exit orifices of the inner conduits are set back from the exit orifice of the outer conduit to enable the gaseous halogenic oxidizing agent in the outer conduit to surround the gaseous starting material exiting said inner conduit, said substrate positioned from 5 millimeters to 15 centimeters from the exit orifice of said outer conduit.

2. A method for forming a deposited film according to claim 1, wherein luminescence is accompanied on the formation of the deposition film.

3. A method for forming a deposited film according to claim 1, wherein said gaseous starting material is a chain silane compound.

4. A method for forming a deposited film according to claim 3, wherein said chain silane compound is a straight chain silane compound.

5. A method for forming a deposited film according to claim 4, wherein said straight chain silane compound is represented by the formula Si$_n$H$_{2n+2}$ wherein n is an integer of 1 to 8.

6. A method for forming a deposited film according to claim 3, wherein said chain silane compound is a branched chain silane compound.

7. A method for forming a deposited film according to claim 1, wherein said gaseous starting material is a silane compound having a cyclic structure of silicon.

8. A method for forming a deposited film according to claim 1, wherein said gaseous starting material is a chain germanium compound.

9. A method for forming a deposited film according to claim 8, wherein said chain germanium compound is represented by the formula Ge$_m$H$_{2m+2}$ wherein m is an integer of 1 to 5.

10. A method for forming a deposited film according to claim 1, wherein said gaseous starting material is a hydrogenated tin compound.

11. A method for forming a deposited film according to claim 1, wherein said gaseous starting material is a tetrahedral type compound.

12. A method for forming a deposited film according to claim 1, wherein said gaseous oxidizing agent (ON) is an oxygen compound.

13. A method for forming a deposited film according to claim 1, wherein said gaseous oxidizing agent (ON) is oxygen gas.

14. A method for forming a deposited film according to claim 1, wherein said gaseous oxidizing agent (ON) is a nitrogen compound.

15. A method for forming a deposited film according to claim 1, wherein said substrate is arranged at a position opposed to the direction in which said gaseous starting material and said gaseous oxidizing agent (ON) are introduced into said reaction space.

16. A method for forming a deposited film on a substrate in a reaction space, which comprises:
   introducing (a) a gaseous starting material for formation of a deposited film (b) a gaseous halogenic oxidizing agent (X) having the property of oxidation action on said starting material, (c) an oxidizing agent (ON) of gaseous oxygen type or nitrogen type oxidizing agents, and (d) a gaseous material (D) containing a component to act as a valence electron controller as the constituent into said reaction space to form a mixture and effect chemical contact therebetween to thereby form a plural number of precursors containing precursors in an excited state, and
   forming said deposited film on said substrate in said reaction space through a gas introducing conduit system using at least one of said precursors as the feeding source for the constituent element of the deposited film, said gas introducing conduit system including a plurality of coaxially aligned conduits each having an exit orifice with an outer conduit adapted to carry said gaseous halogenic oxidizing agent, and at least one inner conduit adapted to carry said gaseous starting material, at least one inner conduit adapted to carry said oxidizing agent, and at least one inner conduit adapted to carry said valence electron controller, said coaxially aligned conduits extending into the film forming space such that the exit orifices of the inner conduits are set back from the exit orifice of the outer conduit to enable the gaseous halogenic oxidizing agent in the outer conduit to surround the gaseous starting material exiting said inner conduit, said substrate positioned from 5 millimeters to 15 centimeters from the exit orifice of said outer conduit.

17. A method for forming a deposited film according to claim 16, wherein luminescence is accompanied on the formation of the deposition film.

18. A method for forming a deposited film according to claim 16, wherein said gaseous starting material is a chain silane compound.

19. A method for forming a deposited film according to claim 18, wherein said chain silane compound is a straight chain silane compound.

20. A method for forming a deposited film according to claim 19, wherein said straight chain silane compound is represented by the formula $Si_nH_{2n+2}$ wherein n is an integer of 1 to 8.

21. A method for forming a deposited film according to claim 18, wherein said chain silane compound is a branched chain silane compound.

22. A method for forming a deposited film according to claim 16, wherein said gaseous starting material is a silane compound having a cyclic structure of silicon.

23. A method for forming a deposited film according to claim 16, wherein said gaseous starting material is a chain germanium compound.

24. A method for forming a deposited film according to claim 23, wherein said chain germanium compound is represented by the formula $Ge_mH_{2m+2}$ wherein m is an integer of 1 to 5.

25. A method for forming a deposited film according to claim 16, wherein said gaseous starting material contains a hydrogenated tin compound.

26. A method for forming a deposited film according to claim 16, wherein said gaseous starting material is a tetrahedral type compound.

27. A method for forming a deposited film according to claim 16, wherein said gaseous oxidizing agent (ON) is an oxygen compound.

28. A method for forming a deposited film according to claim 16, wherein said gaseous oxidizing agent (ON) is oxygen gas.

29. A method for forming a deposited film according to claim 16, wherein said gaseous oxidizing agent (ON) is a nitrogen compound.

30. A method for forming a deposited film according to claim 16, wherein said gaseous halogenic oxidizing agent (X) contains a halogen gas.

31. A method for forming a deposited film according to claim 16, wherein said gaseous halogenic oxidizing agent (X) contains fluorine gas.

32. A method for forming a deposited film according to claim 16, wherein said gaseous halogenic oxidizing agent (X) contains chlorine gas.

33. A method for forming a deposited film according to claim 16, wherein said gaseous halogenic oxidizing agent (X) contains fluorine atoms as the constituent.

34. A method for forming a deposited film according to claim 16, wherein said gaseous halogenic oxidizing agent (X) contains a halogen under nascent state.

35. A method for forming a deposited film according to claim 16, wherein said substrate is arranged at a position opposed to the direction in which said gaseous starting material, and gaseous oxidizing agent (X), the oxidizing agent (ON), and said gaseous material (D) are introduced into said reaction space.

* * * * *

UNITED STATES PATENT AND TRADEMARK OFFICE
CERTIFICATE OF CORRECTION

PATENT NO. : 4,837,048
DATED : June 6, 1989
INVENTOR(S) : SHUNICHI ISHIHARA, ET AL.

It is certified that error appears in the above-identified patent and that said Letters Patent is hereby corrected as shown below:

COLUMN 1

Line 26, ""poly-Si) (H,X)"" should read --"poly-Si (H,X)"--.
    Line 27, "so called" should read --so-called--.

COLUMN 2

Line 31, "give" should be deleted.
    Line 35, "large scale" should read --large-scale--.

COLUMN 3

Line 22, "precursors" should read --plural precursors--.
    Line 27, "a a" should read --a--.
    Line 29, "material" should read --material,--.

COLUMN 4

Line 2, "the ordinary" should read --their ordinary--.
    Line 65, "onto" should read --into--.
    Line 68, "although" should read --through--.

COLUMN 5

Line 10, "any" should read --by--.
    Line 13, "energysaving" should read --energy-saving--.
    Line 36, "so called" should read --so-called--.
    Line 40, "so called" should read --so-called--.

UNITED STATES PATENT AND TRADEMARK OFFICE
CERTIFICATE OF CORRECTION

PATENT NO. : 4,837,048
DATED : June 6, 1989
INVENTOR(S) : SHUNICHI ISHIHARA, ET AL.

It is certified that error appears in the above-identified patent and that said Letters Patent is hereby corrected as shown below:

COLUMN 6

Line 26, "exited" should read --excited--.
Line 32, "continuous" should read --continuously--.
Line 40, "large scale" should read --large-scale--.
Line 48, "one and" should read --one integral unit and--.
Line 51, "large scale" should read --large-scale--.

COLUMN 7

Line 31, "be" should be deleted.
Line 63, "substrate state" should read --surface state--.

COLUMN 9

Line 1, "described" should read --is described--.

COLUMN 10

Line 49, "$N_2O_2$: 2 sccm" should read --$N_2O_4$: 2 sccm--.

COLUMN 11

Line 3, "Example 1," should read --Example 3,--.
Line 14, "substrate: 2" should read --substrate: 3--.
Line 29, "Example 1," should read --Example 4,--.
Line 55, "Example 1," should read --Example 5,--.

UNITED STATES PATENT AND TRADEMARK OFFICE
CERTIFICATE OF CORRECTION

PATENT NO. : 4,837,048
DATED : June 6, 1989
INVENTOR(S) : SHUNICHI ISHIHARA, ET AL.

It is certified that error appears in the above-identified patent and that said Letters Patent is hereby corrected as shown below:

COLUMN 12

Line 13, "Example 5," should read --Example 6,--.
Line 40, "Example 1," should read --Example 7,--.
Line 55, "quart glass" should read --quartz glass--.
Line 66, "Example 7," should read --Example 8,--.

COLUMN 13

Line 24, "Example 1," should read --Example 9,--.
Line 53, "Example 1," should read --Example 10,--.

COLUMN 14

Line 12, "Example 1," should read --Example 11,--.
Line 29, "A-Si:O:H:F:Cl" should read
--A-Si:O:H:F:Cl film--.
Line 42, "Example 1," should read --Example 12,--.

COLUMN 17

Line 15, "Example 13," should read --Example 15,--.
Line 30, "fo" should read --for--.
Line 39, "$\sigma d=8 \times 10^{-9}$ scm." should read
--$\sigma d=8 \times 10^{-9}$ s/cm.--.
Line 44, "Example 13," should read --Example 16,--.

UNITED STATES PATENT AND TRADEMARK OFFICE
CERTIFICATE OF CORRECTION

PATENT NO. : 4,837,048
DATED : June 6, 1989
INVENTOR(S) : SHUNICHI ISHIHARA, ET AL.

Page 4 of 5

It is certified that error appears in the above-identified patent and that said Letters Patent is hereby corrected as shown below:

COLUMN 18

Line 3, "Example 13," should read --Example 17,--.
Line 31, "Example 17," should read --Example 18,--.
Line 55, "by" (first occurrence) should read --be--.
Line 56-57, Insert heading --Example 19--.
Line 57, "Example 13," should read --Example 19,--.

COLUMN 19

Line 17, "example 19," should read --Example 20,--.
Line 46, "Example 13," should read --Example 21,--.

COLUMN 20

Line 5, "Example 13," should read --Example 22,--.
Line 23, "A-Si:O:H:F:Cl:B" should read --A-Si:O:H:F:Cl:B film--.
Line 36, "Example 13," should read --Example 23,--.
Line 62, "$3 \times 10^{-8}$." should read --$3 \times 10^{-8}$ s/cm.--.
Line 66, "Example 23," shoud read --Example 24,--.

COLUMN 21

Line 14, "luminescene" should read --luminescence--.
Line 41, "comprises;" should read --comprises:--.

UNITED STATES PATENT AND TRADEMARK OFFICE
CERTIFICATE OF CORRECTION

PATENT NO. : 4,837,048
DATED : June 6, 1989
INVENTOR(S) : SHUNICHI ISHIHARA, ET AL.

Page 5 of 5

It is certified that error appears in the above-identified patent and that said Letters Patent is hereby corrected as shown below:

COLUMN 22

Line 53, "deposited film (b)" should read
--deposited film (b),--.

Signed and Sealed this

Twenty-ninth Day of May, 1990

Attest:

HARRY F. MANBECK, JR.

*Attesting Officer*  *Commissioner of Patents and Trademarks*